United States Patent
Lardon et al.

[11] Patent Number: 5,997,686
[45] Date of Patent: Dec. 7, 1999

[54] PROCESS FOR SETTING A WORKING RATE DISTRIBUTION IN AN ETCHING OR PLASMA CVD APPARATUS

[75] Inventors: Marcel Lardon, Maienfeld; Rolf Zessack, Buchs; Paul-René Muralt, Wangs, all of Switzerland

[73] Assignee: Tokyo Electron Limited, Tokyo, Japan

[21] Appl. No.: 08/756,022

[22] Filed: Nov. 26, 1996

Related U.S. Application Data

[63] Continuation of application No. 08/395,298, Feb. 27, 1995, abandoned, which is a continuation of application No. 08/096,690, Jul. 23, 1993, abandoned.

[30] Foreign Application Priority Data

Jul. 27, 1992 [CH] Switzerland .......................... 2360/92

[51] Int. Cl.⁶ .................................................. H05H 1/00
[52] U.S. Cl. .................. 156/345; 118/723 MW; 204/298.38
[58] Field of Search ................ 156/345; 118/723 E, 118/723 MW, 723 R; 204/298.02, 298.31, 298.38

[56] References Cited

U.S. PATENT DOCUMENTS

| | | | |
|---|---|---|---|
| 4,297,162 | 10/1981 | Mundt et al. | 156/345 X |
| 4,342,901 | 8/1982 | Zajac | 156/646 X |
| 4,367,114 | 1/1983 | Steinberg et al. | 156/345 |
| 4,624,767 | 11/1986 | Obinata | 156/345 X |
| 4,844,775 | 7/1989 | Keeble | 204/298.34 X |
| 5,074,985 | 12/1991 | Tamura et al. | 204/298.11 |
| 5,102,496 | 4/1992 | Savas | 156/345 X |
| 5,284,544 | 2/1994 | Mizatani et al. | 156/345 |
| 5,391,281 | 2/1995 | Hieronymi et al. | 204/298.37 |

FOREIGN PATENT DOCUMENTS

| | | |
|---|---|---|
| 62-40380 | 2/1987 | Japan . |
| J6 2040-380 | 2/1987 | Japan .......................... 118/723 MW |
| 62-219912 | 9/1987 | Japan . |
| 63-206484 | 8/1988 | Japan . |

*Primary Examiner*—Thi Dang
*Attorney, Agent, or Firm*—Wood, Herron & Evans, L.L.P.

[57] ABSTRACT

A process and apparatus for setting a working rate distribution along a work surface which is being AC plasma-enhanced reactively coated, or reactively or non-reactively etched in an AC plasma, and in which process a plasma volume of given volume is utilized, comprises placing the work surface in the plasma volume, positioning a setting surface of a distribution setting body opposite the work surface, the setting body being surrounded by the plasma volume substantially on all sides of the setting body, and setting the working rate distribution by selecting either the material of the setting surface, the quality of the setting surface, a distance relationship between the setting surface and the work surface, or the shape of the setting surface.

8 Claims, 7 Drawing Sheets

0.2 sccm RF 196W, MF 400W, DC-178V 60s
150D/70H X 5.3 Å/s 3.6% Y 5.4 Å/s ±8.2%

0.5 sccm, RF 142 W, MF 540W, DC -102V 60s
150D/70H 4.3 Å/s ± 17.1% Bef.Zentr.

0.5 sccm, RF 142W, MF 540W, DC - 107V 80s
150D/70H 3.1Å/s ± 8.5%

PROCESS FOR SETTING A WORKING RATE DISTRIBUTION IN AN ETCHING OR PLASMA CVD APPARATUS

RELATED APPLICATION

This application is a continuation of application Ser. No. 08/395,298, filed Feb. 27, 1995, entitled "PROCESS FOR SETTING A WORKING RATE DISTRIBUTION IN AN ETCHING OR PLASMA CVD APPARATUS", now abandoned, which is a continuation of application Ser. No. 08/096,690, filed Jul. 23, 1993 having the same title now abandoned.

FIELD AND BACKGROUND OF THE INVENTION

The present invention relates to a process for setting the working rate distribution along a work surface which is being AC plasma-enhanced, reactively coated, or reactively or non-reactively etched in an AC plasma, in which process a plasma volume is utilized which contains the surface. The invention also relates to an etching or plasma CVD apparatus having a vacuum receptacle, at least one electric generator for generating an AC plasma in a plasma volume (PL) in the receptacle, and a workpiece carrier surface for receiving at least one workpiece to be treated.

It is known to employ plasma-enhanced processes, for example in the fabrication of semiconductors, in order to deposit thin films or to etch workpieces, in particular semiconductor wafers. In this respect reference is made, for example, to S. M. Sze, VLSI Technology, McGraw-Hill, International Book Company, London 1983, pages 120, 303.

For etching poorly or non-conducting surfaces it is customary to use a plasma generated by AC energy, likewise for coating conducting substrate with non-conducting layers or of non-conducting substrate. In such plasma processes, furthermore, the problem is encountered that through local differences of the plasma density the working rate distribution on the workpiece becomes non-uniform. This is during the stated plasma etching operation, whether reactive or non-reactive, as well as during plasma coating, in particular also during reactive plasma coating with the stated AC-generated plasmas. It is, for example, known that the coating or the etching of a planar wafer is often significantly more intensive in the center than at the edge. It can, in principle, be assumed that the plasma density in the proximity of the surface decreases with respect to that in the remaining plasma volume, due to the absorption and recombination phenomena in surface regions whereby charge carriers are removed from the plasma. In addition, at the surface most often molecules are absorbed which are foreign to the process, i.e. which are desorbed and ionized by the plasma discharge. The negatively charged ions generated therein recombine with positive ones and, in turn, remove positive gas ions from the plasma.

For this reason one should endeavor to implement the distance between such a plasma-worked workpiece and surfaces to be as large as possible in order to avoid, in the workpiece region, a change of the plasma density through the stated surfaces.

In order to achieve as high a plasma density as possible in the plasma discharge volume, however, its dimensions must be large in comparison with the length of the free path of the ionized gas atoms. These are noble gas atoms in a non-reactive etching process, and reactive gas molecules in a reactive etching process or in a plasma-enhanced CVD coating process. The mean free path length of ionized atoms is, for example, approximately 6.4 cm at $10^{-3}$ mbars argon partial pressure.

One is consequently forced to implement the structural height of a vacuum receptacle, which defines the plasma volume above the workpiece to be worked, under consideration of the stated free path length to be relatively large, but for reasons of the entire receptacle volume to be made available one does not, for example, keep distances laterally between workpiece carrier and receptacle wall, which would permit the homogeneous working of the workpiece. The lateral distance between receptacle wall and workpiece surface or workpiece carrier is customarily chosen to be on the order of magnitude of the stated free path length or even smaller. This results, inter alia, in the more intensive surface working in the center of the workpiece surface.

Other surfaces, such as the electrode surfaces etc., also influence the working rate distribution. Generally, working rate inhomogeneities occur due to the finitely extending surfaces involved.

It is known to counteract the inhomogeneous working rate distribution by introducing the gas as uniformly as possible above the workpiece, whether it is a noble gas in a non-reactive process or a reactive gas in a reactive process, or even introducing the gas with specific distribution in order to counteract the stated inhomogeneities of the plasma distribution brought about by the wall.

Such an approach is only effective, however, with relatively large pressures, thus with pressures in which the free path length in any case is relatively small. In this connection reference is made, for example, to Wang, D. N. K., White et al., U.S. Pat. No. 4,872,947.

Reference is furthermore made to: European Patent EP-A-0 040 081 (U.S. Pat. No. 4,349,409); EP-A-0 284 436; EP-A-0 200 133 (U.S. Pat. No. 4,600,464), U.S. Pat. No. 4,631,105; GB-A-2 100 759 (U.S. Pat. Nos. 4,451,547, 4,507,375, 4,552,824, and 4,265,991); and EP-A-0 467 046.

SUMMARY OF THE INVENTION

The present invention is based on the task of creating a process of the initially stated type by which, while maintaining a large plasma discharge volume, the working rate distribution on the work surface can be set simply and flexibly.

For this purpose the process according to the invention is distinguished by providing the surface of a distribution setting body, which is essentially surrounded on all sides by the plasma volume, oppose to the work or worked surface and that the working rate distribution is set through the material and/or surface quality of the surface of the body and/or their distance to the worked surface.

By having the worked surface opposite to a body with a distribution setting surface which is essentially surrounded on all sides by plasma volume, the size of the volume, and consequently the achieved plasma density achieved in the plasma volume is only insignificantly impaired. The surface of the stated body opposing the worked surface is provided with which even in the central regions, the same effects, which previously have been discussed for example with respect aid the side wall of the receptacle, come to bear or can now specifically be utilized in order to realize therewith a desired, most often intentionally homogeneous working rate profile, over the entire surface to be worked. The term "working rate" is here understood to be the quantity of material etched off the worked surface per unit time and area in an etching process using the aid of an AC plasma, or, in a plasma CVD process, the quantity of material deposited per unit time and area on the worked surface.

Through the selection of material and/or choice of the surface quality of the stated body surface and/or through the selection of their relative distance with respect to the worked surface, the stated distribution is specifically set or adjusted. Since the worked surface does not need to be planar at all, and in order to achieve the stated desired distribution, the setting surface of the stated body also does not need to be planar; by the term "distance relation" is generally understood the relative position of worked and setting surface, viewed along both surfaces.

The process according to the invention can in principle be used in all plasma-enhanced etching or coating processes in which the working effect does not emanate ow from a working source since the worked surface is at least partially covered by the setting surface of the body provided according to the invention.

According to another feature of the invention, the distance relationship and therewith, depending on the shape of the worked surface, also the shape of the setting surf ace of the body is selected so that the worked surface is essentially everywhere under the same influence of surfaces.

Furthermore, regularity according to another feature of the invention, is preferably maintained.

The generation of the plasma can take place by microwave coupling or it can be generated by an HF discharge between electrodes, customarily called capacitive coupling, and is, at least today, generated in a preferred embodiment by a capacitive HF discharge between electrodes as well as inductive field coupling, the latter preferably by means of an intermediate frequency field.

Procedures or apparatuses of the last stated type are known to the applicant for example from B. A. Probyn, Vacuum, 18 (5), 253 (1968), "Sputtering of Insulators in an RF Discharge" as well as from EP-A-0 467 046.

Further embodiments of the process according to the invention are also disclosed.

For the solution of the task according to the invention, namely, as stated, to influence specifically over the extent of the worked surface, the charge carrier concentration, regardless of how it is reduced in conventional apparatuses, for example through the side wall regions of the receptacles, an etching or plasma CVD apparatus is suggested which is distinguished according to the invention.

Preferred embodiments of this apparatus are also specified.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the invention will be explained in conjunction with drawings and examples. In the drawings:

FIG. 10a schematically illustrates a distribution which is analogous to that of FIG. 9a;

DESCRIPTION OF THE PREFERRED EMBODIMENTS

Figure 1:
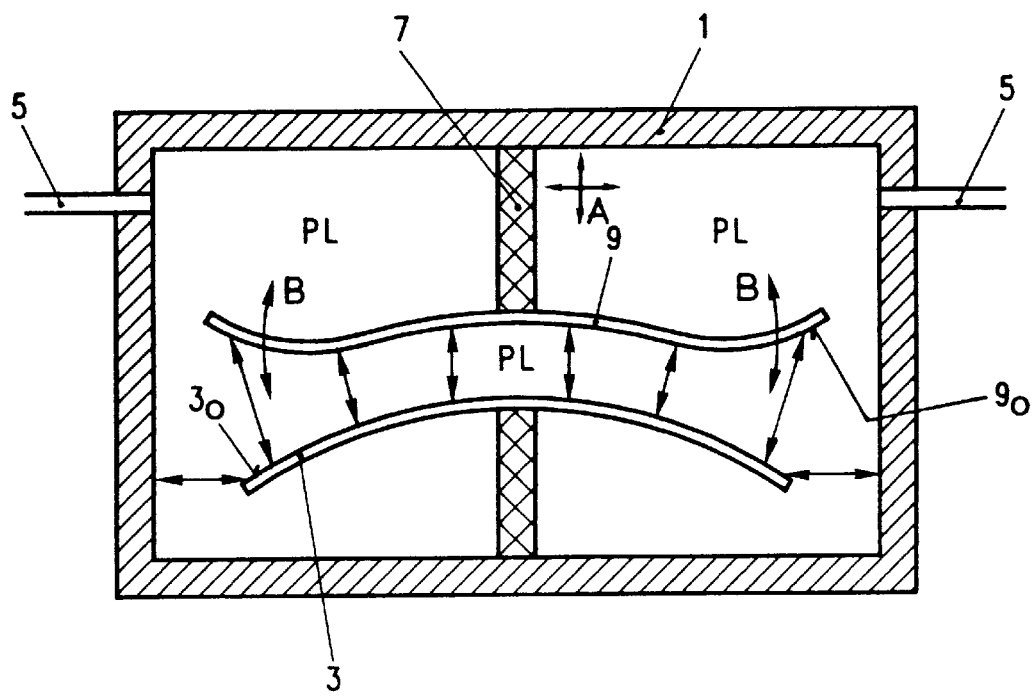
FIG. 1 is a schematic sectional view of a vacuum receptacle which defines an AC plasma discharge volume, with a schematically depicted workpiece of any shape to be treated and with a setting surface of a body according to the invention for the explanation of the principle procedure according to the present invention.

FIG. 1 depicts a vacuum chamber or receptacle 1 wherein a plasma discharge volume PL is defined. The sources for exciting the plasma in the plasma discharge volume PL are not shown in FIG. 1. These can be a microwave generator, a high frequency or HF generator which feeds a pair of electrodes disposed at a distance from one another, and/or a coil configuration customarily disposed outside of the vacuum receptacle and preferably connected to an intermediate frequency generator with the aid of which the plasma is inductively excited. The last stated form of excitation with excitation frequencies in the kHz to MHz range, preferably from 200 kHz to 1 MHz, is preferably combined with capacitive high frequency excitation by means of two electrodes, customarily excited at 13.56 MHz.

A workpiece 3 to be treated is disposed in the plasma discharge volume PL in FIG. 1, on a workpiece carrier (not shown), of, for the time being, any surface shape. The treatment of the work surface $3_0$, facing the plasma volume PL can be subjected to reactive or non-reactive etching or to a plasma-enhanced chemical vapor deposition process (PECVD). Accordingly, through schematically depicted gas inlets 5, a working gas is introduced which, in the case of non-reactive etching is, for example, helium or argon, or in a reactive sputtering or coating process, is a gas reacting chemically in the plasma.

According to the invention, a body with a treatment rate setting surface $9_0$ is provided oppose the surface $3_0$ to be treated and, as depicted with an electrically insulating suspending member 7, electrically insulated from the remaining parts of the apparatus. Through the setting body 9 the volume of the plasma discharge volume PL is only insignificantly reduced. The body 9 is essentially surrounded on all sides by the plasma discharge volume PL.

As depicted in FIG. 1, the surface $9_0$ is disposed so that, as indicated by the double arrows, the plasma density-reducing surface effects, for example of the receptacle wall and the stated surface $9_0$, act along the surface to be worked to the intended degree on the working rate distribution. The effect of the surface $9_0$ is set through the selection of its material, its surface structure, its shape and dimensions, i.e. distance to the surface $3_0$, so that along the surface $3_0$ the desired working rate profile is generated.

The surface $9_0$ can comprise a metal, a semiconductor or an insulating material wherein the setting body 9 is formed accordingly from the stated material or the desired surface $9_0$ is formed by coating a body comprising another material.

In order to be able to flexibly modify the effect of the setting surface $9_0$, be this from working process to working process or, in some cases, even during one working process, the setting body 9, as depicted at A, can, if desired, be adjusted or moved laterally or with respect to its distance to the surface $3_0$, and/or its shape can be specifically set, as shown at B, e.g. by bending the body 9.

Currently, the procedure according to the invention is preferably used for the non-reactive etching process in an argon ion plasma, wherein the plasma is generated capacitively with high frequency between two electrodes and is, in addition, inductively densified by means of a coil configuration at approximately 300 kHz to 500 kHz.

Figure 2:
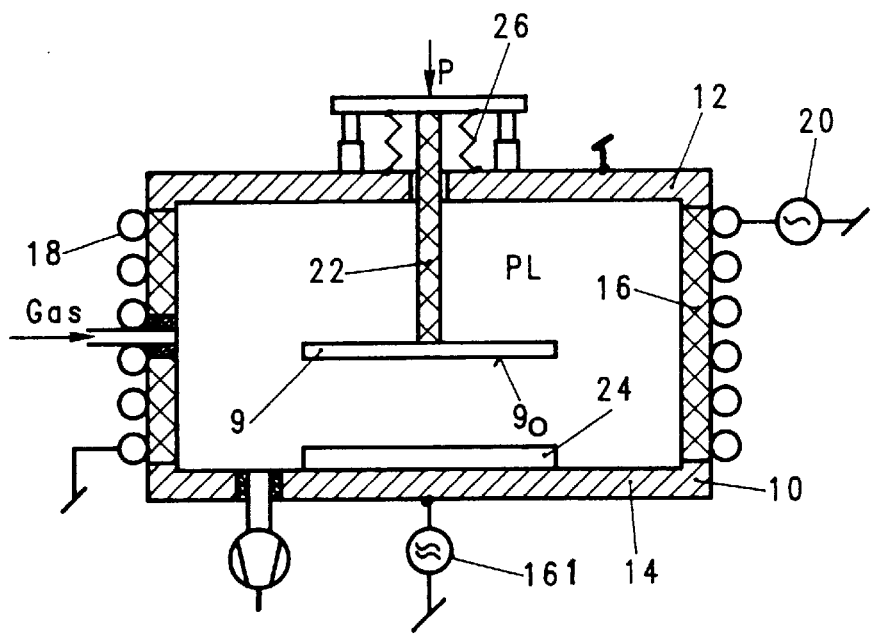
FIG. 2 is a view similar to FIG. 1 which schematically illustrates an preferred embodiment of an etching or plasma CVD apparatus according to the invention.

An apparatus which is currently preferably used for this purpose is depicted schematically in FIG. 2 which, as the expert can readily recognize, can be used equally well for reactive etching or plasma-enhanced CVD. Although in FIG. 2 adjustment possibilities for the position of the setting surface $9_0$ provided according to the invention are provided, this possibility is not yet provided in the currently tested apparatuses.

With respect to similarly constructed apparatuses usable according to the invention, reference is made to the above stated EP-A-0 467 046 as well as to the article "Sputtering of Insulators in an RF discharge" which, with respect to possible apparatus configurations, should be considered as an integrated component part of the present description.

According to FIG. 2 the receptacle or chamber 10 comprises two, essentially opposing electrode parts 12 and 14, which are operated via matching networks (not shown here) but readily familiar to the expert, by a high frequency generator 161, customarily operating at 13.56 MHz, for capacitive plasma generation in the plasma discharge volume PL. The two electrodes and parts 12 and 14 forming the receptacle wall are separated by a dielectrical shell part 16 which separates a coil configuration 18 from the interior of the receptacle.

As is known from EP-A-0 467 046 measures are taken so that, depending on the operating pressure in the interior of the receptacle, the dielectric shell part 16 can readily absorb the mechanical pressure loading. The coil configuration 18 is used, potentially again via known matching networks, operated by an intermediate frequency generator 20 operating at 200 kHz to approximately 1 MHz, preferably today at approximately 200 kHz to 500 kHz.

On an insulating suspending member 22, at a floating potential and disposed for working of planar workpieces 24, for example directly on part 14, is provided a planar setting plate 9 whose material, surface quality, radial extension or distance from the surface of the workpieces 24 is chosen selectively. In the embodiment depicted in FIG. 2, the distance of the plate-like setting body 9, as depicted with P, can also be changed during the working process, for which purpose the insulating suspending member 22 is suspended for example above a bellows arrangement 26.

Figure 3:
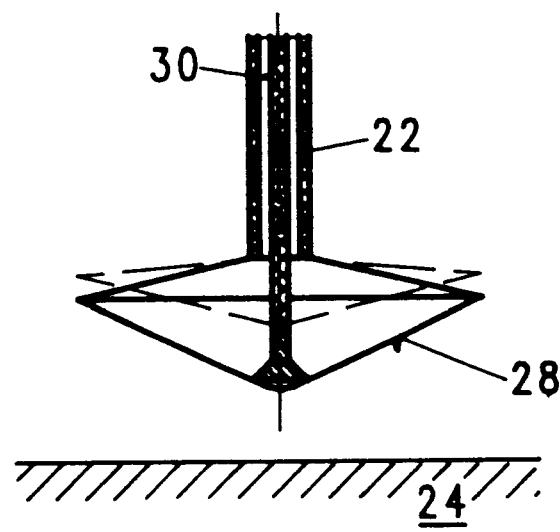
FIG. 3 is a sectional view of a further embodiment of the setting surface of the body provided according to the invention.
Figure 4:
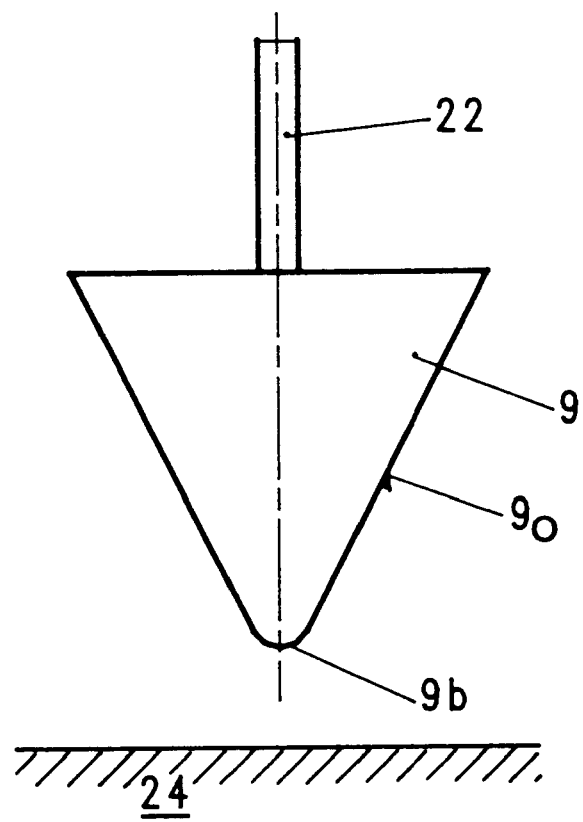
FIG. 4 is a sectional view of a further embodiment of the setting surface provided according to the invention.

FIG. 3 shows by example how the shape of a setting body according to the invention can be changed. To this end it is, as depicted, implemented as bellows 28. Its shape and its distance relationship to the workpiece 24 are changed through electrically insulated intervention, for example by means of a ram 30 in the insulating suspending member 22. In this way a conical setting body shape with rounded vertex at $9_b$ according to FIG. 4 is realized and, additionally, according to FIG. 3, changeable with respect to shape.

Preferably the shortest distance between the setting body and worked surfaces is provided at the center, in particular in the case of planar workpieces 24 such as semiconductor wafers which lie with their peripheral region relatively near the lateral receptacle wall regions. The minimum distance between worked workpiece surface and setting surface $9_0$ is preferably not smaller than the mean free path length of those working gas atoms or molecules which, at the partial pressure obtaining during the working, have the greatest mean free path length of the working gas component involved in the process.

In a further relatively expensive embodiment of an apparatus according to the invention for carrying out the process according to the invention, the setting body is mounted in the plasma discharge volume of the receptacle defining a spatial surface or plate-form so that it is disposed concentrically over the workpiece to be worked. Its height above the substrate can be set from the outside, it can further be rotated from the outside by ±180° about the axis perpendicular to the substrate and further can be tilted by ±30° with respect to its axis in the horizontal plane, thus perpendicular to the stated axis of rotation, preferably from the outside.

To decrease the expense of construction, one or more of the stated possibilities can be implemented so as to be not operatable from the outside.

Furthermore, the body with the setting surface can preferably be shifted with respect to its centricity or eccentricity relative to the workpiece surface to be treated or it can be implemented eccentrically. Adjustment of the setting surface through the appropriate adjustment of the setting body from the outside permits optimizing the treatment effect on the workpiece to be treated without the vacuum receptacle needing to be flooded every time.

EXAMPLE 1

An apparatus according to FIG. 2 is operated as follows:

| Process: | non-reactive etching process in an argon plasma |
|---|---|
| Pressure: | $2 \cdot 10^{-3}$ mbars |
| High frequency: | 13.56 MHZ, 206 W |
| Intermediate frequency: | 400 kHz, 400 W |
| Duration of etching: | 100 s |
| Workpiece: | Silicon wafer, diameter 200 mm, coated with 200 nm silicon dioxide Setting body/setting |
| Setting body: | Quartz plate, diameter 150 mm, 144 mm above the silicon wafer, essentially centered. |

Figure 5:
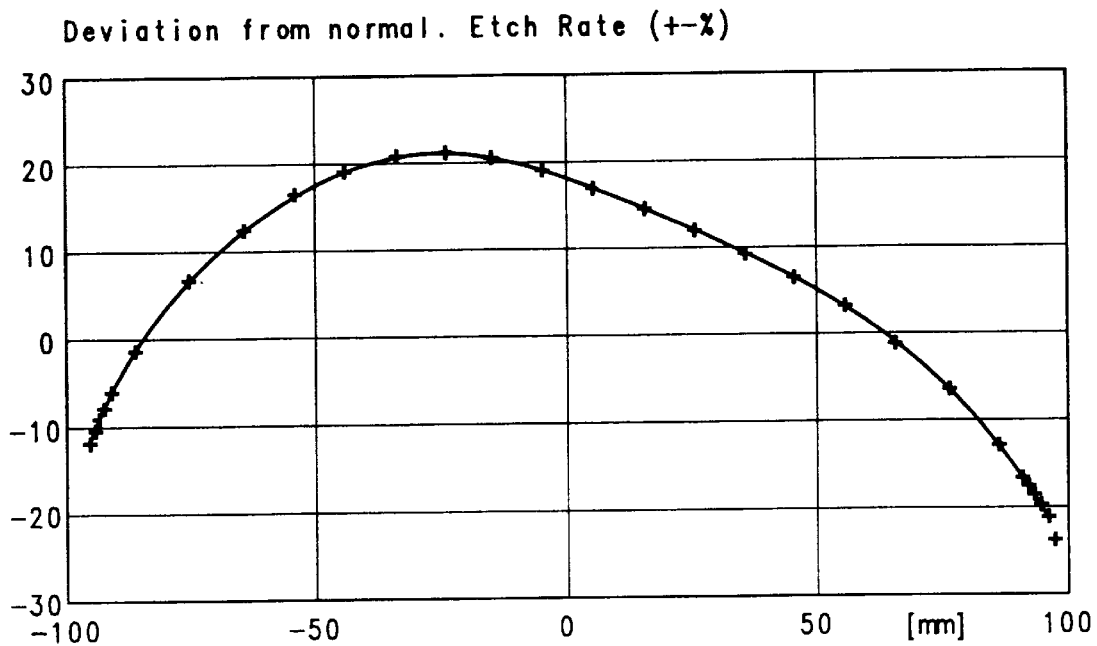
FIGS. 5 to 8 are graphs plotting different etch rate distributions in the non-reactive etching of a planar workpiece surface or (FIG. 8) the dependence of the etch rate distribution on the distance between etched surface and setting surface of the body provided according to the invention.

The deviations of the etch rate, measured radially over the entire wafer diameter, represented as percentage of the desired etch rate after the etching duration of 100 s are shown in FIG. 5.

In the center region the etch rate is excessive by approximately 23% while it is equally strongly decreased in the peripheral region. The etch rate is consequently significantly higher in the center of the wafer than at the edge wherein it is evident in FIG. 5 that the etch rate distribution is not precisely centrally symmetrical. The conclusion can be drawn:

the two-dimensional correction body is too far above the wafer, it practically does not have any effect on the etch rate distribution.

EXAMPLE 2

| | |
|---|---|
| Working process: | etching process in argon plasma |
| Pressure: | $2 \cdot 10^{-3}$ mbars |
| High frequency: | 13.56 MHz, 145 W |
| Intermediate frequency: | 400 kHz, 400 W |
| Etching duration: | 100 s |
| Workpiece: | Silicon wafer, diameter 200 mm, coated with 200 nm silicon dioxide |
| Setting body: | Quartz plate, diameter 200 mm, 80 mm above the wafer |

Figure 6:
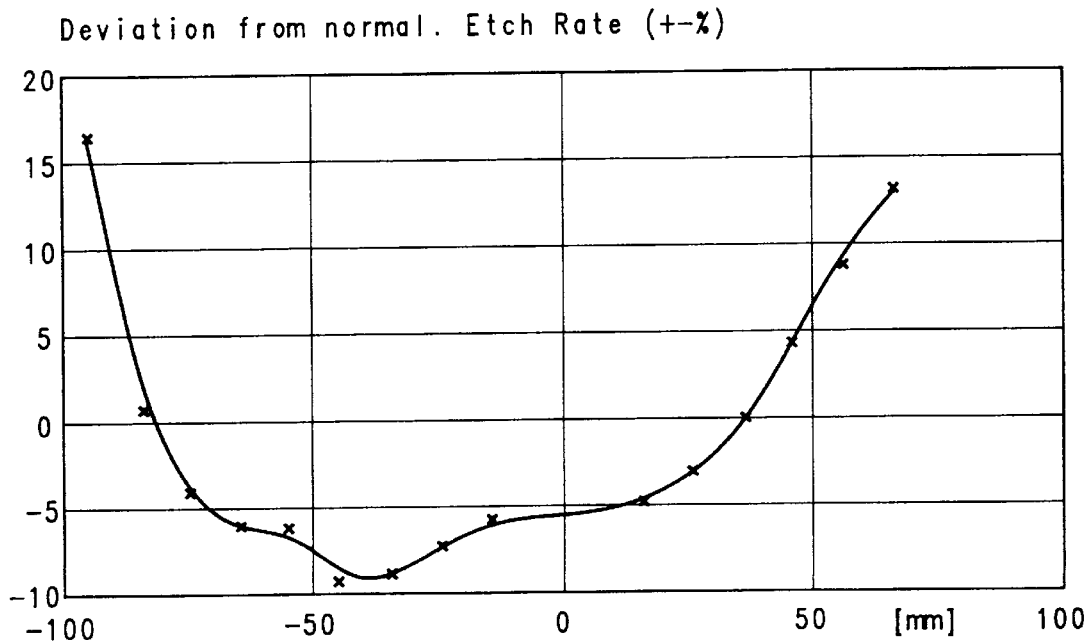

Identically to FIG. 5, the resulting etch rate distribution during the etching duration of 100 s is depicted in FIG. 6.

Conclusion

The etch rate distribution over the water diameter has been inverted. The etch rate in the peripheral region of the wafer is significantly higher than in the central region. Here too, it can be seen that a centrally symmetrically etch rate distribution is not yet achieved, the setting body, also according to FIG. 6, must be shifted to the right.

Furthermore, it can be seen that the diameter of the setting body is too great and/or its distance from the wafer is too small.

EXAMPLE 3

| | |
|---|---|
| Treatment process: | etching in argon plasma |
| Pressure: | $6 \cdot 10^{-4}$ mbars |
| High frequency: | 13.56 MHz, 147 W |
| Intermediate frequency: | 400 kHz, 400 W |
| Etching duration: | 60 s |
| Setting body: | Al perforated plate, diameter of plate 150 mm, 80 mm. |

Figure 7:
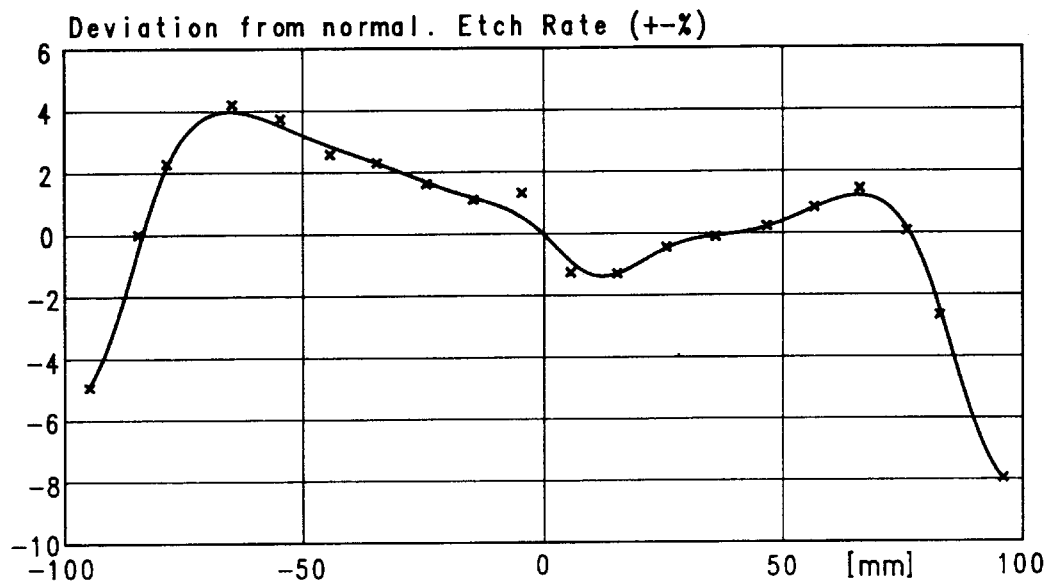

In FIG. 7 the result is given in the same representation as in FIGS. 5 and 6.

Conclusion

The etch rate distribution was improved from the differences of the order of magnitude of ±23% (Example 1) to ±6%. The correction body consequently has a favorable position, a favorable surface structure (apertures) and a favorable dimension.

It can be seen that while maintaining the distance as in Example 2, the results were also significantly improved by changing the dimension and the surface structure, which is significant in view of the fact that the minimum distance between setting surface and workpiece surface should not be reduced beyond limits in accordance with the free path lengths of the involved gas atoms.

Figure 8:
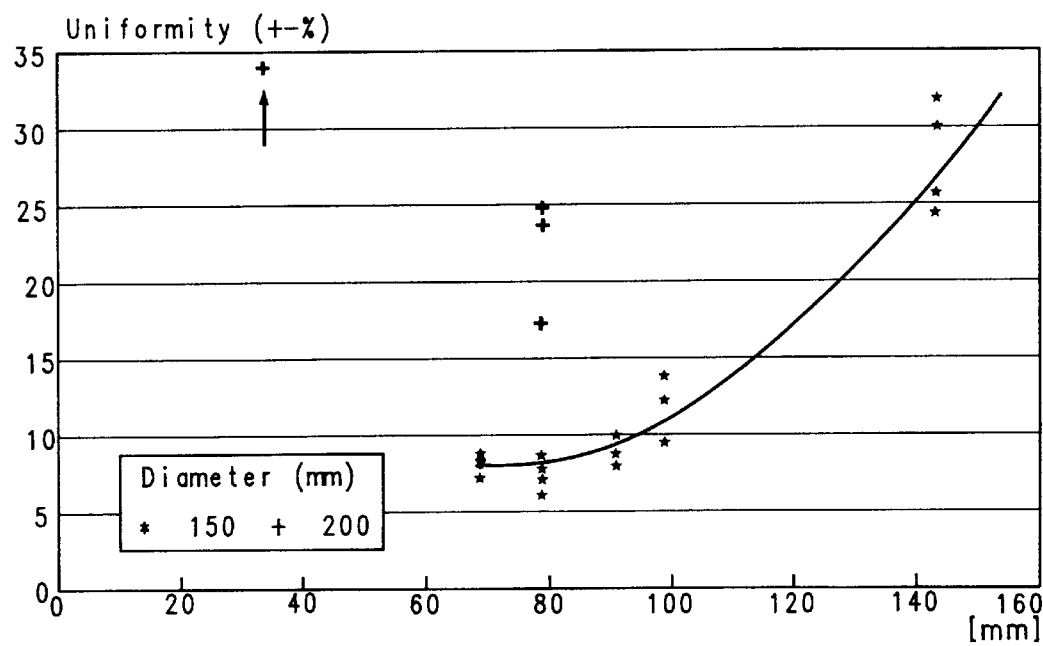

FIG. 8 illustrates the maximum percentage of etch rate deviations, which were measured in each instance on one wafer, as a function of the distance of the setting surface from the wafer surface. The results of those experiments are provided, which were carried out under the conditions of Example 3, i.e. with planar Al perforated sheet setting bodies having a diameter of 150 mm, however, at a varying distance of the setting surfaces from the working surfaces.

Those results of experiments are provided with + which were carried out under the conditions according to Example 2, i.e. with setting body plates having a diameter of 200 mm comprising quartz with a varying distance of the setting surfaces from the working surfaces.

It can be seen on that basis that for setting body diameters of 150 mm the most favorable distance for a good distribution is approximately 80 mm.

At a diameter of the setting body of 200 mm, at a distance of approximately 35 mm from the substrate, only its edge is etched, at 80 mm distance the edge etch rate is still significantly higher than that in the center (Example 2). If an optimum is to be found, the distance of the setting body from the workpiece surfaces must be further increased which, however, can be of disadvantage due to the dimensioning of the receptacle which overall must be kept to a minimum.

As has also been shown clearly with reference to the examples, according to the invention a simple way is provided for influencing the working rate on a workpiece with respect to its distribution along the worked workpiece surface, be this in a reactive or a non-reactive etching process or be this in a plasma-enhanced CVD process.

From the etching experiments with correction body plates in different settings of the process parameters: high frequency power of the plasma discharge, intermediate frequency power, and pressure; the following conclusions can be drawn:

The distribution of the etch rate, which presumably reflects an image of the plasma distribution over the workpiece, depends on the shape and amplitude of process setting parameters. However, in contrast to the mean etch rate or the self bias of the workpiece, it is not a continuous function of these process parameters.

The form and amplitude of the etch rate distribution as a specific example of the working rate distribution addressed according to the invention can be influenced with the aid of the setting body according to the invention. The following finding is of significance: the working rate distribution is optimal when the setting body has mirror symmetrically the same form as the working rate distribution to be corrected on the workpiece.

Figure 9A:
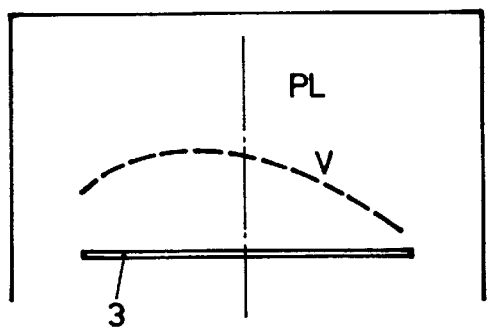
FIG. 9a schematically illustrates an uncorrected etch rate distribution over a wafer.
Figure 9B:
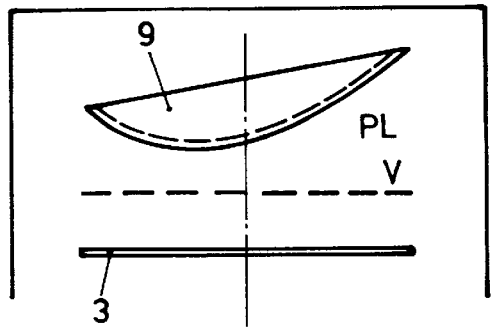
FIG. 9b schematically illustrates a correction of the etch rate distribution of FIG. 9a, by a setting body which is mirror-symmetrically to the distribution to be corrected.

FIG. 9a plots the etch rate distribution over, for example, a wafer as the workpiece. It corresponds to a skewed dome surface. If, given these facts, a corresponding skewed dome-shaped correction body 9 is provided, a planar etch rate distribution v essentially results.

Optimum results are obtained with a setting body vault of a high hollow quartz sphere which can also be mounted to be skewed and thereby covers most requirements.

Figure 10A:
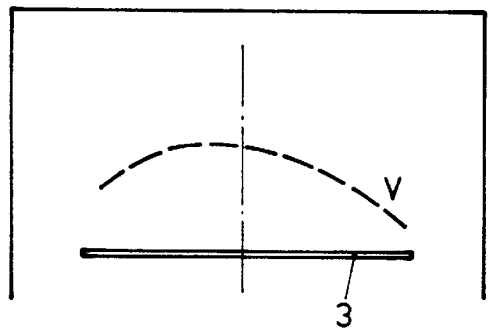
Figure 10B:
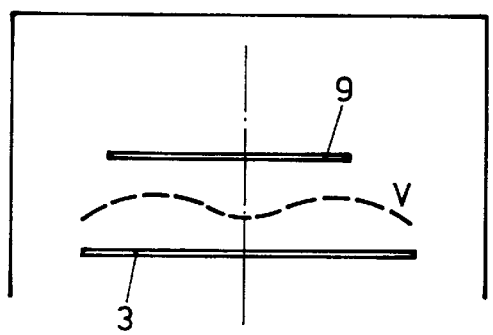
FIG. 10b schematically illustrates the corrected distribution by means of a setting body plate.

A horizontally mounted plate can be used as a poorer yet usable approximation. As previously mentioned, the setting body or plate can be mounted so as to be adjustable with respect to its height as well as also in its spatial orientation with respect to the working center of the workpiece. Size and shape of the plate can likewise be adapted to the requirements. The distribution in the shape of a skewed dome according to FIG. 9a becomes a crater-form distribution with less amplitude when using a plate, such as depicted in FIGS. 10a and 10b.

Furthermore, how the height of a correction plate comprising quartz (150 mm$\phi$) influences the profile of the distribution curve along the X- and Y-axes of a wafer during the etching process, was investigated experimentally.

Figure 11:
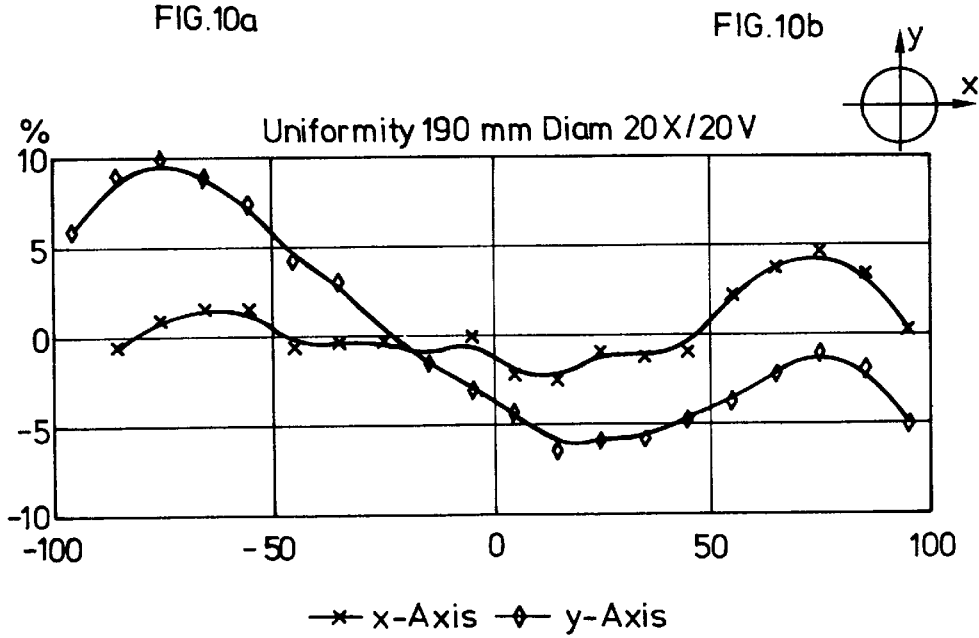
FIG. 11 is a graph with explanatory symbol, plotting etch rate distributions in the X- and Y-axes on a 190 mm wafer in percent deviation from a mean value.

According to FIG. 5 the uncorrected etch rate distribution is parabola-like with the deepest etch rates at the edge of the wafer and an interspaced maximum. In the etching process according to Example 2 and setting plate set at least nearly optimal with respect to the height over the wafer, results in the percentage deviation of the rate distribution depicted in FIG. 11 of the rate distribution along the two wafer axes X and Y. This figure shows that the rate distribution along the X-axis does indeed extend essentially horizontally. It is skewed, however, along the Y-axis from the top left to the bottom right of the curve. A percentage rate distribution deviation of ±8.2% results.

If the skewed distribution in the Y-axis is corrected so that this curve also extends horizontally, a substantial improvement of the etch rate distribution is to be expected.

To this end, the shape and the horizontal position of the setting body plate were adapted as follows:

a) Adaptation of the shape of the setting plate:
   Process conditions
   Pressure: 0.087 Pa
   High frequency: 13.56 MHz, 142 W
   Intermediate frequency: 400 kHz, 540 W
   (bias: −102 V; −107 V)

Figure 12:
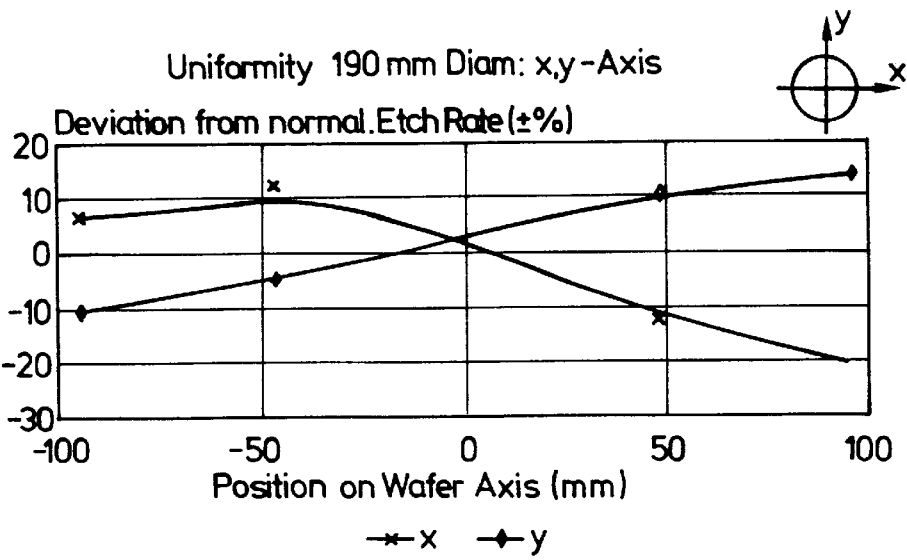
FIG. 12 is a graph with explanatory symbol, plotting the uncorrected rate distribution with specific etching process parameters.

The quartz disk having a diameter of 150 mmφ was positioned 70 mm above the wafer and yielded a distribution of the etch rate of ±17.1% according to FIG. 12.

Figure 13:
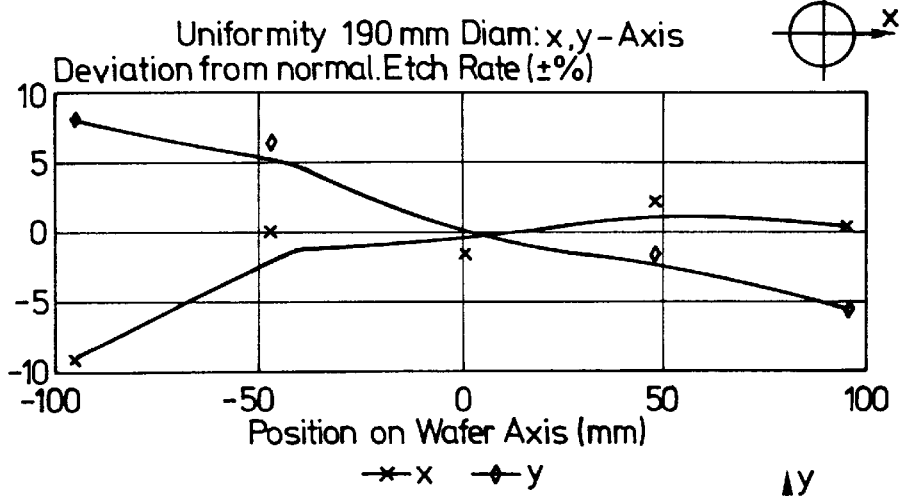
FIG. 13 is a graph with explanatory symbols, plotting in the process forming essentially the basis of the distribution according to FIG. 12, the etch rate distribution corrected by means of setting body plates.
Figure 13:
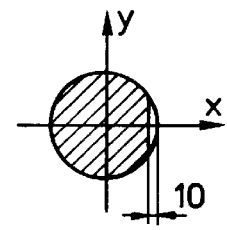

The setting body quartz disk was reduced on the right side by one segment of 10 mm width. The results with respect to the etch rate distribution is shown in FIG. 13. The improved distribution has a deviation of ±8.5%.

b) Adaptation of shape and position of the setting plate:
   Process conditions
   Pressure: 0.087 Pa
   High frequency: 13.56 MHz, 78 W
   Intermediate frequency: 400 kHz, 300 W
   (bias: −124 V; −121 V)

Figure 14:
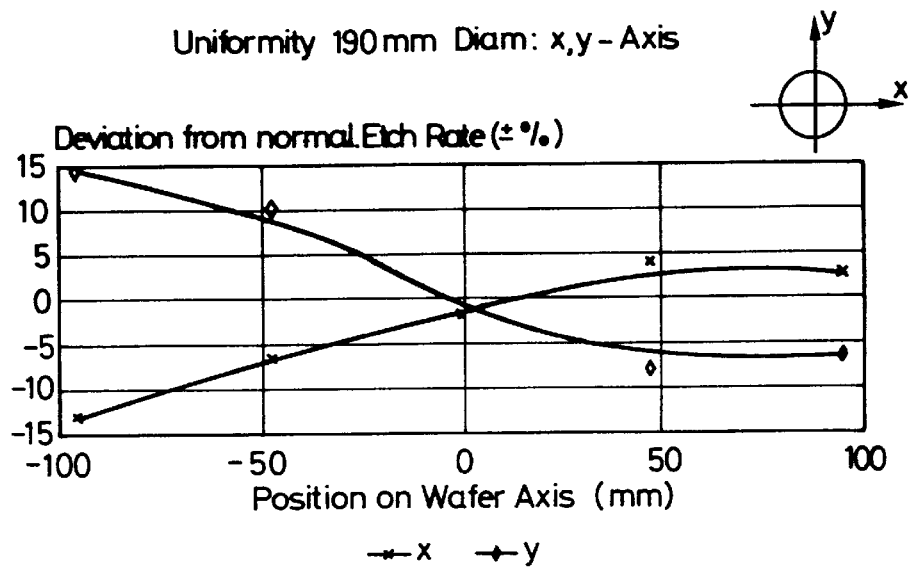
FIG. 14 is a graph with explanatory symbol, plotting an uncorrected etch rate distribution with modified process parameters.

The stated quartz disk with a diameter of 150 mmφ mounted at a height of 70 mm yields a distribution of ±13.9% according to FIG. 14.

Figure 15:
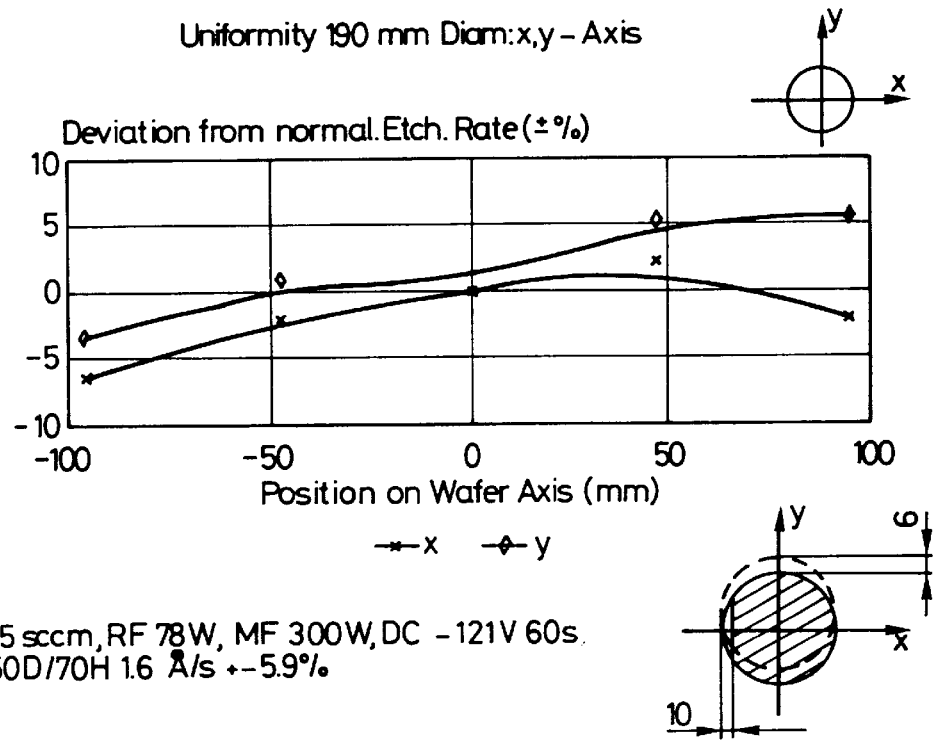
FIG. 15 is a graph with explanatory symbols, plotting the corrected etch rate distribution in the process which leads to the uncorrected distribution according to FIG. 14.

The same disk at the same height, but on the left side reduced by one segment of 10 mm and overall shifted by 6 mm in the direction of the negative Y-axis, according to FIG. 15, yields an improved distribution of ±5.9%.

In summary it can be stated that etch rate distributions or, more generally, working rate distributions of better than ±10% can be achieved under different process conditions.

The following table shows different process conditions and the achieved distribution deviations on a 190 mm wafer by means of the stated setting body plate with a diameter of 150 mmφ. The height above the wafer was, with the exception of experiment d), 70 mm, in experiment d, in contrast, 80 mm. By segmenting the shape and the position of the plate according to the distributions to be corrected, different selections were made.

|    | Pressure (Pa) | RF power (Watts) | IF power (Watts) | Neg. bias (Volts) | Vert.190 mm (± %) |
|----|---------------|------------------|------------------|-------------------|-------------------|
| a) | 0.087         | 78               | 300              | 121               | 5.9               |
| b) | 0.087         | 142              | 540              | 107               | 8.5               |
| c) | 0.067         | 167              | 540              | 115               | 7.8               |
| d) | 0.087         | 196              | 400              | 152               | 8.5               |

While specific embodiments of the invention have been shown and described in detail to illustrate the application of the principles of the invention, it will be understood that the invention may be embodied otherwise without departing from such principles.

What is claimed is:

1. An apparatus for etching or plasma CVD, comprising;
   a vacuum chamber;
   an electric generator for generating an AC plasma in a plasma volume in the chamber;
   a workpiece carrier surface for receiving at least one workpiece having work surface to be treated;
   an insulating setting body having a setting surface mounted opposite the work surface, the setting body being electrically insulated from the chamber and operating at a floating potential to set a working rate distribution along the work surface facing the setting surface; and
   a microwave generator operatively connected to the vacuum chamber via the workpiece carrier surface for generating the plasma.

2. An apparatus for etching or plasma CVD, comprising;
   a vacuum chamber;
   an electric generator for generating an AC plasma in a plasma volume in the chamber;
   a workpiece carrier surface for receiving at least one workpiece having work surface to be treated;
   an insulating setting body having a setting surface mounted opposite the work surface, the setting body being electrically insulated from the chamber and operating at a floating potential to set a working rate distribution along the work surface facing the setting surface;
   a double electrode configuration on or in the chamber; and
   a high frequency generator operatively connected to the electrodes for generating the plasma.

3. Apparatus as stated in claim 2, wherein the apparatus is laid out as a triode apparatus having a coil configuration substantially coaxial to the double electrode configuration and an AC, intermediate frequency generator in the range of 200 kHz to 1 MHz connected to the coil configuration.

4. An apparatus for etching or plasma CVD, comprising;
   a vacuum chamber;
   at least one electric generator for generating an AC plasma in a plasma volume in the chamber;
   a workpiece carrier surface for receiving at least one workpiece having work surface to be treated; and
   an insulating setting body having a setting surface mounted opposite the work surface, the setting body being electrically insulated from the chamber and operating at a floating potential to set a working rate distribution along the work surface facing the setting surface,
   wherein the setting surface is adjustable with respect to at least one of its material, its shape or its surface quality.

5. An apparatus for etching or plasma CVD, comprising;
   a vacuum chamber;
   at least one electric generator for generating an AC plasma in a plasma volume in the chamber;
   a workpiece carrier surface for receiving at least one workpiece having work surface to be treated; and
   an insulating setting body having a setting surface mounted opposite the work surface, the setting body being electrically insulated from the chamber and operating at a floating potential to set a working rate distribution along the work surface facing the setting surface, wherein the setting surface comprises electrically insulating material and is formed by a coating on said setting body.

6. An apparatus for etching or plasma CVD, comprising;

a vacuum chamber;

at least one electric generator for generating an AC plasma in a plasma volume in the chamber;

a workpiece carrier surface for receiving at least one workpiece having work surface to be treated; and an insulating setting body having a setting surface mounted opposite the work surface, the setting body being electrically insulated from the chamber and operating at a floating potential to set a working rate distribution along the work surface facing the setting surface, wherein the setting surface is structured to be a perforated plate.

7. An apparatus for etching or plasma CVD, comprising;

a vacuum chamber;

at least one electric generator for generating an AC plasma in a plasma volume in the chamber;

a workpiece carrier surface for receiving at least one workpiece having work surface to be treated; and an insulating setting body having a setting surface mounted opposite the work surface, the setting body being electrically insulated from the chamber and operating at a floating potential to set a working rate distribution along the work surface facing the setting surface, wherein the setting surface is bent convexly with rounded vertex.

8. The apparatus of claim 7, wherein the setting surface is substantially conical.

* * * * *